United States Patent
Drynan

(10) Patent No.: US 9,123,786 B2
(45) Date of Patent: *Sep. 1, 2015

(54) INTERCONNECT LINE SELECTIVELY ISOLATED FROM AN UNDERLYING CONTACT PLUG

(71) Applicant: MICRON TECHNOLOGY, INC., Boise, ID (US)

(72) Inventor: John M. Drynan, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/319,284

(22) Filed: Jun. 30, 2014

(65) Prior Publication Data

US 2014/0312504 A1 Oct. 23, 2014

Related U.S. Application Data

(60) Division of application No. 13/012,578, filed on Jan. 24, 2011, now Pat. No. 8,796,815, and a division of application No. 12/503,685, filed on Jul. 15, 2009, now Pat. No. 7,888,774, and a continuation of (Continued)

(51) Int. Cl.
*H01L 21/00* (2006.01)
*H01L 21/768* (2006.01)

(Continued)

(52) U.S. Cl.
CPC .... *H01L 21/76885* (2013.01); *H01L 21/76831* (2013.01); *H01L 21/76834* (2013.01); *H01L 23/481* (2013.01); *H01L 27/10814* (2013.01); *H01L 27/10855* (2013.01);

(Continued)

(58) Field of Classification Search
CPC ............ H01L 21/76885; H01L 23/481; H01L 21/76831; H01L 27/10855; H01L 27/10814; H01L 21/76834; H01L 27/10885; H01L 27/10888; H01L 27/10897; H01L 2924/0002
USPC ................... 257/306, 767; 438/253
See application file for complete search history.

(56) References Cited

U.S. PATENT DOCUMENTS

| | | | |
|---|---|---|---|
| 3,437,436 A | 4/1969 | Pereboom et al. | 423/375 |
| 5,155,056 A | 10/1992 | Jeong-Gyoo | |
| 5,318,925 A | 6/1994 | Kim | 438/253 |

(Continued)

FOREIGN PATENT DOCUMENTS

| | | | | |
|---|---|---|---|---|
| JP | 10098100 A | 4/1998 | | H01L 21/768 |
| JP | 10214895 A | 8/1998 | | H01L 21/768 |

(Continued)

*Primary Examiner* — Laura Menz
(74) *Attorney, Agent, or Firm* — Dickstein Shapiro LLP

(57) ABSTRACT

A means for selectively electrically connecting an electrical interconnect line, such as a bit line of a memory cell, with an associated contact stud and electrically isolating the interconnect line from other partially underlying contact studs for other electrical features, such as capacitor bottom electrodes. The interconnect line can be formed partially-connected to all contact studs, thereby allowing the electrical features to be formed in closer proximity to one another for higher levels of integration, and in subsequent steps of fabrication, the contact studs associated with memory cell features other than the interconnect line can be isolated from the interconnect line by the removal of a silicide cap, or the selective etching of a portion of these contact studs, and the formation of an insulating sidewall between the non-selected contact stud and the interconnect line.

12 Claims, 9 Drawing Sheets

Related U.S. Application Data application No. 11/639,218, filed on Dec. 15, 2006, now Pat. No. 7,573,087, and a division of application No. 11/205,185, filed on Aug. 17, 2005, now abandoned, and a division of application No. 10/863,203, filed on Jun. 9, 2004, now Pat. No. 6,969,882, and a division of application No. 10/214,169, filed on Aug. 8, 2002, now Pat. No. 6,781,182, and a division of application No. 09/595,922, filed on Jun. 16, 2000, now Pat. No. 6,511,879.

(51) Int. Cl.
*H01L 27/108* (2006.01)
*H01L 23/48* (2006.01)

(52) U.S. Cl.
CPC ... *H01L 27/10885* (2013.01); *H01L 27/10888* (2013.01); *H01L 27/10897* (2013.01); *H01L 2924/0002* (2013.01)

(56) References Cited

U.S. PATENT DOCUMENTS

| | | | |
|---|---|---|---|
| 5,422,315 A | 6/1995 | Kobayashi | |
| 5,444,021 A | 8/1995 | Chung et al. | 438/696 |
| 5,525,552 A | 6/1996 | Huang | 438/297 |
| 5,576,242 A | 11/1996 | Liu | 438/586 |
| 5,670,404 A | 9/1997 | Dai | |
| 5,670,427 A | 9/1997 | Cho | 438/669 |
| 5,686,747 A | 11/1997 | Jost et al. | |
| 5,801,443 A | 9/1998 | Ohno | |
| 5,847,463 A | 12/1998 | Trivedi et al. | |
| 5,895,239 A | 4/1999 | Jeng et al. | |
| 5,918,120 A | 6/1999 | Huang | |
| 5,929,524 A | 7/1999 | Drynan et al. | 257/758 |
| 5,935,766 A | 8/1999 | Cheek et al. | |
| 5,939,746 A | 8/1999 | Koyama et al. | 257/306 |
| 5,953,609 A | 9/1999 | Koyama et al. | 438/253 |
| 5,968,333 A | 10/1999 | Nogami et al. | |
| 5,981,380 A | 11/1999 | Trivedi et al. | |
| 6,001,734 A | 12/1999 | Drynan | 438/637 |
| 6,020,642 A | 2/2000 | Drynan | 257/763 |
| 6,025,227 A * | 2/2000 | Sung | 438/253 |
| 6,060,351 A | 5/2000 | Parekh et al. | |
| 6,071,802 A | 6/2000 | Ban et al. | |
| 6,096,632 A | 8/2000 | Drynan | 438/618 |
| 6,197,682 B1 | 3/2001 | Drynan et al. | 438/639 |
| 6,312,985 B1 | 11/2001 | Wu et al. | 438/253 |
| 6,511,879 B1 * | 1/2003 | Drynan | 438/253 |
| 6,511,896 B2 | 1/2003 | Basceri et al. | 438/459 |
| 6,524,912 B1 | 2/2003 | Yang et al. | 438/258 |
| 6,617,250 B2 | 9/2003 | Basceri et al. | 438/689 |
| 6,649,466 B2 | 11/2003 | Basceri et al. | 438/240 |
| 6,667,228 B2 | 12/2003 | Lee et al. | 438/592 |
| 6,696,339 B1 | 2/2004 | Tang | 438/254 |
| 6,713,378 B2 * | 3/2004 | Drynan | 438/618 |
| 6,767,806 B2 | 7/2004 | Basceri et al. | 438/487 |
| 6,781,182 B2 | 8/2004 | Drynan | 257/306 |
| 6,856,009 B2 | 2/2005 | Bolken et al. | 257/686 |
| 6,917,111 B2 | 7/2005 | Lee et al. | 257/760 |
| 6,927,126 B2 | 8/2005 | Park et al. | 438/253 |
| 6,930,341 B2 | 8/2005 | Park et al. | 257/296 |
| 6,962,846 B2 | 11/2005 | Fishburn et al. | 438/243 |
| 6,969,882 B2 | 11/2005 | Drynan | 257/306 |
| 7,030,473 B2 | 4/2006 | Reiss et al. | 257/666 |
| 7,053,462 B2 | 5/2006 | Yang et al. | 257/534 |
| 7,061,115 B2 * | 6/2006 | Drynan | 257/767 |
| 7,115,928 B2 | 10/2006 | Tang | 257/296 |
| 7,122,404 B2 | 10/2006 | Bolken et al. | 438/110 |
| 7,179,681 B2 | 2/2007 | Bolken et al. | 438/106 |
| 7,268,039 B2 | 9/2007 | Fishburn et al. | 438/253 |
| 7,273,779 B2 | 9/2007 | Fishburn et al. | 438/253 |
| 7,321,150 B2 | 1/2008 | Fishburn et al. | 257/309 |
| 7,411,240 B2 | 8/2008 | Park et al. | 257/306 |
| 7,573,087 B2 * | 8/2009 | Drynan | 257/306 |
| 7,659,160 B2 | 2/2010 | Belyansky et al. | 438/216 |
| 7,684,205 B2 | 3/2010 | Pai | |
| 7,888,774 B2 | 2/2011 | Drynan | |
| 2002/0146894 A1 | 10/2002 | Basceri et al. | 438/459 |
| 2002/0187606 A1 | 12/2002 | Drynan | 438/253 |
| 2003/0013248 A1 | 1/2003 | Basceri et al. | 438/200 |
| 2003/0013277 A1 | 1/2003 | Basceri et al. | 438/459 |
| 2003/0017680 A1 | 1/2003 | Basceri et al. | 438/459 |
| 2003/0077891 A1 | 4/2003 | Drynan | 438/618 |
| 2003/0082903 A1 | 5/2003 | Yang et al. | 438/629 |
| 2004/0108535 A1 | 6/2004 | Drynan | 257/300 |
| 2004/0178482 A1 | 9/2004 | Bolken et al. | 257/678 |
| 2004/0178488 A1 | 9/2004 | Bolken et al. | 257/686 |
| 2004/0262657 A1 | 12/2004 | Drynan | 257/296 |
| 2005/0023662 A1 | 2/2005 | Bolken et al. | 257/678 |
| 2005/0026412 A1 | 2/2005 | Drynan | 438/597 |
| 2005/0106779 A1 | 5/2005 | Bolken et al. | 438/106 |
| 2005/0106806 A1 | 5/2005 | Fishburn et al. | 438/243 |
| 2005/0118760 A1 | 6/2005 | Fishburn et al. | 438/239 |
| 2005/0208729 A1 | 9/2005 | Fishburn et al. | 438/424 |
| 2006/0033123 A1 | 2/2006 | Drynan | 257/202 |
| 2006/0170025 A1 | 8/2006 | Drynan | 257/306 |
| 2007/0096190 A1 | 5/2007 | Drynan | 257/306 |
| 2007/0141777 A1 | 6/2007 | Fishburn et al. | 438/243 |
| 2007/0145556 A1 | 6/2007 | Bolken et al. | 257/678 |
| 2010/0013048 A1 | 1/2010 | Drynan | 257/532 |
| 2011/0115008 A1 | 5/2011 | Drynan | |

FOREIGN PATENT DOCUMENTS

| | | | | |
|---|---|---|---|---|
| JP | 10284492 A | 10/1998 | | H01L 21/3205 |
| JP | 2000150814 A | 5/2000 | | H01L 27/108 |

* cited by examiner

INTERCONNECT LINE SELECTIVELY ISOLATED FROM AN UNDERLYING CONTACT PLUG

RELATED APPLICATION DATA

This application is a divisional of U.S. patent application Ser. No. 13/012,578, filed Jan. 24, 2011, which is a divisional of U.S. patent application Ser. No. 12/503,685, filed Jul. 15, 2009, now U.S. Pat. No. 7,888,774, which is a continuation of U.S. patent application Ser. No. 11/639,218, filed Dec. 15, 2006, now U.S. Pat. No. 7,573,087, which is a divisional of U.S. patent application Ser. No. 11/205,185, filed Aug. 17, 2005, now abandoned, which is a divisional of U.S. patent application Ser. No. 10/863,203, filed Jun. 9, 2004, now U.S. Pat. No. 6,969,882, which is a divisional of U.S. patent application Ser. No. 10/214,169, filed Aug. 8, 2002, now U.S. Pat. No. 6,781,182, which is a divisional of U.S. patent application Ser. No. 09/595,922, filed Jun. 16, 2000, now U.S. Pat. No. 6,511,879. The entirety of each of these applications and patents is hereby incorporated by reference herein.

FIELD OF THE INVENTION

This invention relates to a semiconductor device and a method of manufacturing such a device, wherein signal lines (e.g., bit lines of a memory device, etc.) may be isolated from adjacent electrical conductors.

BACKGROUND OF THE INVENTION

Modern integrated circuit designers confront problems related to the need for increasingly smaller size and higher levels of integration. In the art of integrated circuit fabrication, and particularly when dealing with modern memory circuits, circuit manufacturers must design memory cells that are more densely constructed such that the basic elements making up the cell are closer together. This increasingly close proximity of the discrete electrical features within a memory cell, such as dynamic random access memory (DRAM) cells, becomes problematic in light of the increasing potential for shorting between adjacent electrical conductors. This shorting may cause a memory cell to function improperly or not at all.

An additional concern in the manufacture of integrated circuits is the increasing complexity and cost related to the necessity for diminishing size of the memory devices. The desire to utilize fewer stages of fabrication has led designers of memory cells to strive to simultaneously perform, at a given stage of fabrication, as many necessary steps as possible. An example of this may be seen in the standard technology of fabricating capacitor-over-bit-line (COB) type DRAM cells, which typically employs a process wherein all contacts to the memory cell active area are formed simultaneously. Thus, both bit line and capacitor contacts to the semiconductor substrate are formed using a single layering and etching step (utilizing material such as polysilicon), which creates contact studs over which the additional features of the memory cell are fabricated.

Specifically in a process such as described above, after the contact studs are formed in the memory cell, a dielectric layer is deposited and a bit line contact-hole pattern is lithographically delineated and subsequently etched down to the top of the stud corresponding to the bit line connection to the active area on the substrate below. A plug is next formed within each contact-hole, typically of doped polysilicon, and the conductive layers for the bit lines (typically silicide, polycide, or tungsten-based material) are deposited and subsequently delineated using lithographic-etching techniques. An interlayer dielectric is next deposited around the bit line and a capacitor contact-hole pattern is lithographically delineated and etched down between the formed bit lines to the tops of the studs corresponding to the capacitor bottom electrode connections to the active area on the substrate below. This fabrication step is completed when the capacitor contact-holes are then plugged with doped polysilicon or another conductor. Then the process of cell fabrication continues on to the formation of the capacitor features.

This standard method of fabricating memory cells utilizes the single-step forming of contact studs for both capacitors and bit lines, and the forming of bit line contacts and bit lines. Though this method is useful in reducing the steps required to form contacts to active areas of a substrate, it is desirable that the contacts, and subsequently the fully formed features, be located in a more densely packed array. It is also desirable to have the electrical features and interconnects, exemplified by bit line and capacitor features, arranged in such a more densely packed array without increasing the probability of shorting.

SUMMARY OF THE INVENTION

The present invention relates to integrated circuit fabrication and more particularly to selectively electrically connecting an electrical interconnect line with an associated contact to an active area and electrically isolating the interconnect line from other underlying contacts for other electrical features.

More specifically, in this invention a first interconnect line is formed over two underlying contact holes such that it is electrically connected to a first polysilicon stud but is electrically isolated from a second stud. The line is essentially formed over the first stud and partially over the second stud, and is thereafter electrically isolated from the second studs, thereby allowing the electrical features to be formed in closer proximity to one another for higher levels of integration.

The present invention also provides a method for efficiently connecting interconnect lines to a plurality of selected contact studs while maintaining electrical isolation from other non-selected plugs.

The above-described and other advantages and features of the invention will be more clearly understood from the following detailed description which is provided in connection with the accompanying drawings.

DETAILED DESCRIPTION OF PREFERRED EMBODIMENTS

DRAM memory circuits are currently the most popular type of memory circuits used as the main memory of processor-based systems. Therefore, the invention will be discussed in connection with DRAM memory circuits. However, the invention herein disclosed has broader applicability and is not limited to DRAM memory circuits. It may be used in any other type of memory circuit, such as an SRAM (static random access memory), as well as in any other circuit in which electrical contacts are formed in close proximity to, and intended to be insulated from, other circuit devices.

Also, the terms "wafer" and "substrate" are used interchangeably and are to be understood as including silicon, silicon-on-insulator (SOI), and silicon-on-sapphire (SOS) technology, doped and undoped semiconductors, and other semiconductor structures. Furthermore, references to a "wafer" or "substrate" in the following description, do not exclude previous processing steps utilized to form regions or junctions in or on the base semiconductor structure or foundation.

No particular order is required for the method steps described below, with the exception of those logically requiring the results of prior steps. Accordingly, while many of the steps discussed below are discussed as being performed in an exemplary order, this order may be altered.

The present invention relates to a semiconductor device and a method of fabricating the same whereby electrical features in close proximity to one another may be electrically isolated, thereby reducing the potential for undesirable shorting.

Figure 1:
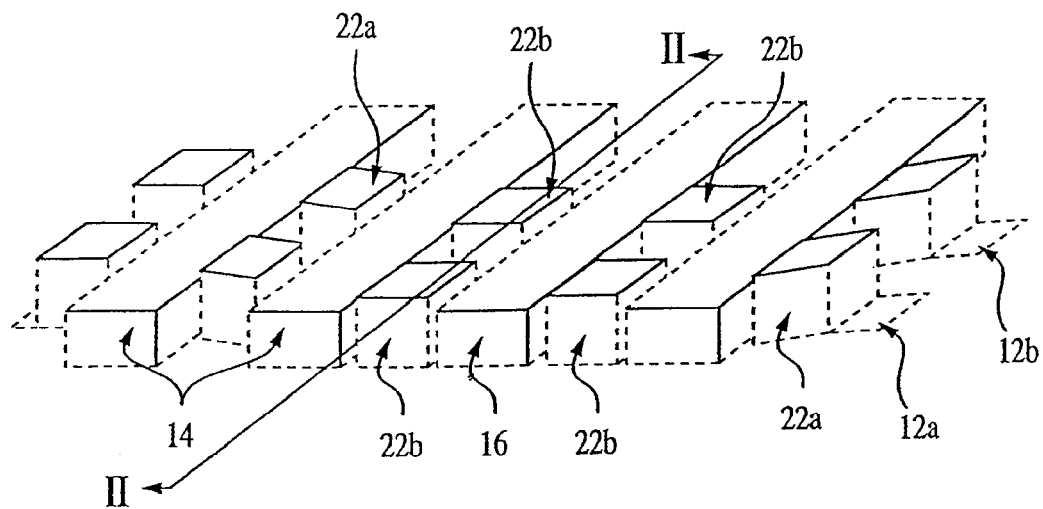
FIG. 1 and FIG. 2 show a semiconductor substrate with contact studs formed between gate structures and connecting to active areas within the substrate.
Figure 2:
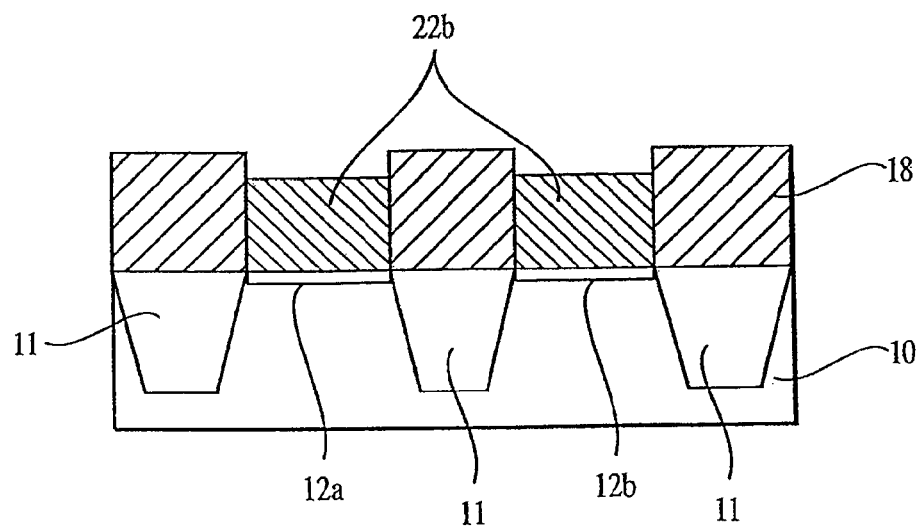

FIGS. 1 and 2 show a DRAM cell array at an early stage of cell formation. FIG. 2 is a cross-section view of FIG. 1, through line II. Active areas 12a and 12b are formed in a substrate 10. Gate structures, including wordline gates 14 and dummy isolation gates 16, are formed over the substrate by techniques known in the art. Though not necessary to the invention herein disclosed, active areas (e.g., source and drain areas 12a and 12b) are typically formed by an ion implantation into the silicon substrate, and the gate structures 14, 16 are typically formed by depositing onto the semiconductor substrate a thin gate oxide followed by a conductive material such as polysilicon, then a lower resistance metal such as tungsten or a silicide such as WSi or TiSi. The gate pattern is etched into the multilayer structure down to the substrate to produce wordline gates 14 and dummy gates 16, after which the substrate is implanted with various dopants to form the active area source and drain regions 12a, 12b, for transistors. A dielectric sidewall spacer and cap (not shown) are also typically formed around and over the gate stacks to aid in the implantation process for transistor formation and to separate the gate from the contacts required to connect the active areas on both sides of the gate. The gates of access transistors of a DRAM cell are typically laid out as a wordline gate 14, which is typically located between a bit line contact and a capacitor contact, and the dummy isolation gate 16 is typically used to assist in certain self-aligned fabrication processes.

As depicted in FIGS. 1 and 2, an insulating dielectric layer 18 (e.g., silicon dioxide or BPSG, etc.) is deposited over and around the gate structures 14 and 16. Next, using standard photolithography techniques, such as ion plasma dry etching techniques, holes (not shown) for contact studs 22 are formed down to the active areas 12a, 12b. This is followed by depositing polycrystalline silicon by LPCVD (low pressure chemical vapor deposition) utilizing silane and a dopant such as phosphine (for N-type studs) to fill the holes to form the contact studs 22. Excess polysilicon on top of the dielectric layer 18 is removed by a dry etch-back, a wet etch-back, or CMP technique. Some of the contact studs 22a, will form electrical contacts with the bit lines 26 (see FIG. 6), while other contact studs 22b will form electrical contacts (see FIG. 16) for capacitor bottom electrodes; however all contact studs 22a and 22b are formed simultaneously.

Figure 3:
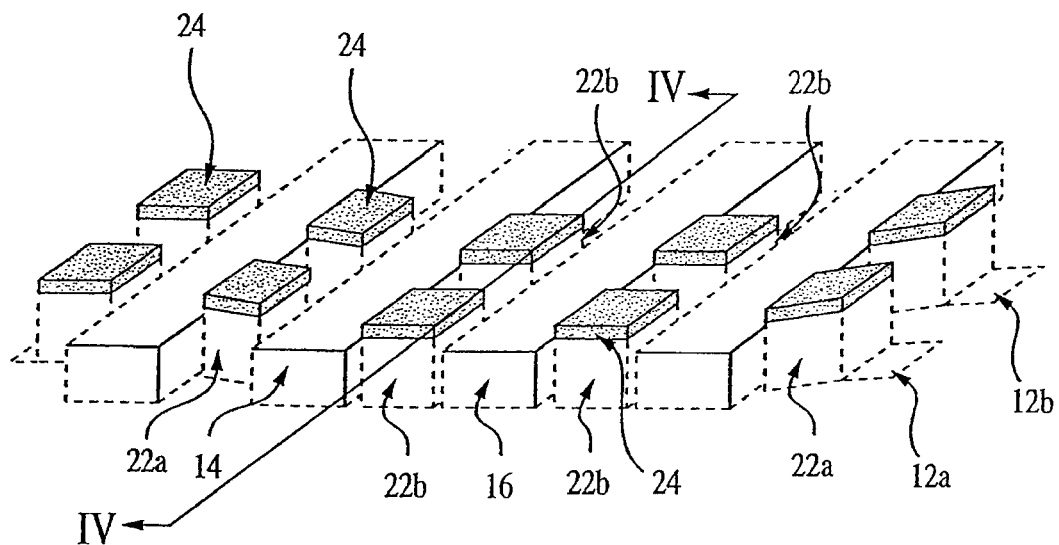
FIG. 3 and FIG. 4 show the structure depicted in FIG. 1 and FIG. 2 at a subsequent stage of processing wherein caps have been formed over the contact studs.
Figure 4:
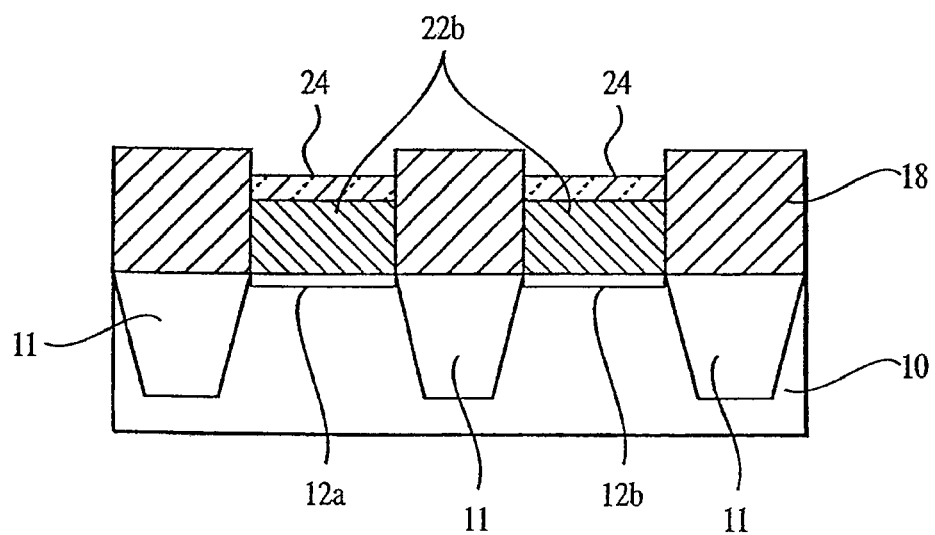

Referring to FIGS. 3 and 4 (FIG. 4 shows a cross-section view of FIG. 3 through line IV), after the contact studs 22a, 22b are formed, silicide caps 24 are formed over the tops of the contact studs 22a, 22b. These silicide caps 24 are formed by selective CVD-deposition of Ti to form $TiSi_2$, or by using a metal deposition, thermal reaction, unreacted metal removal process, also commonly used to form $TiSi_2$. The preferred material utilized to form the silicide caps 24 includes any metals in Groups IV, V, VI, VII, and VIII of the periodic table, with Ti, Co, W, Mo, and Ni being the most common.

Due to the selective silicide formation, the contact stud 22a, 22b on which the silicide cap 24 is formed must be made of silicon, either entirely or at least the portion near the top thereof, in order to provide a silicon layer with which to react a metal to form the silicide.

Figure 5:
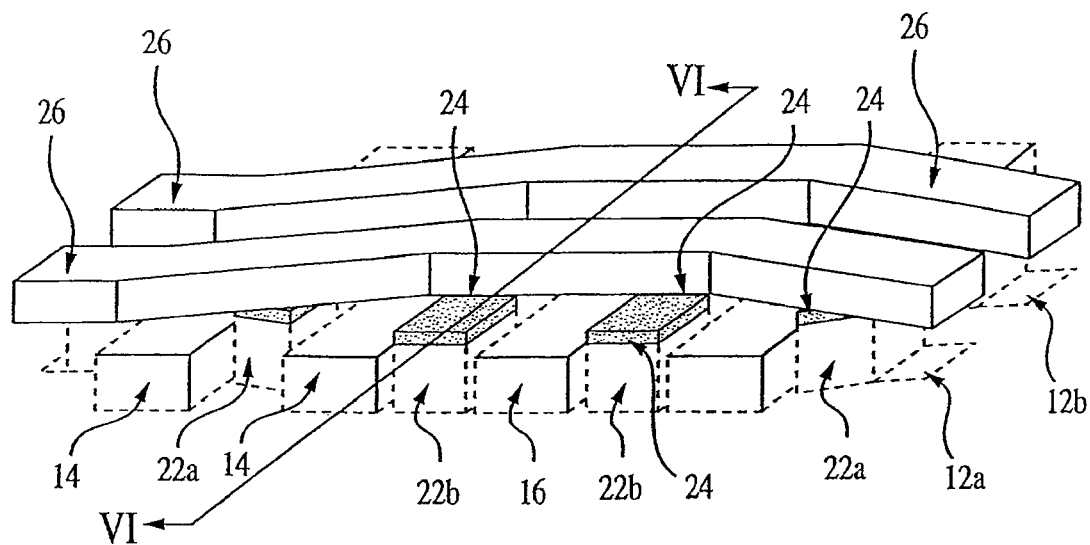
FIG. 5 and FIG. 6 show the structure depicted in FIG. 3 and FIG. 4 at a subsequent stage of processing wherein at least one bit line has been formed over selected contact studs and is thereby connected to the underlying active areas.
Figure 6:
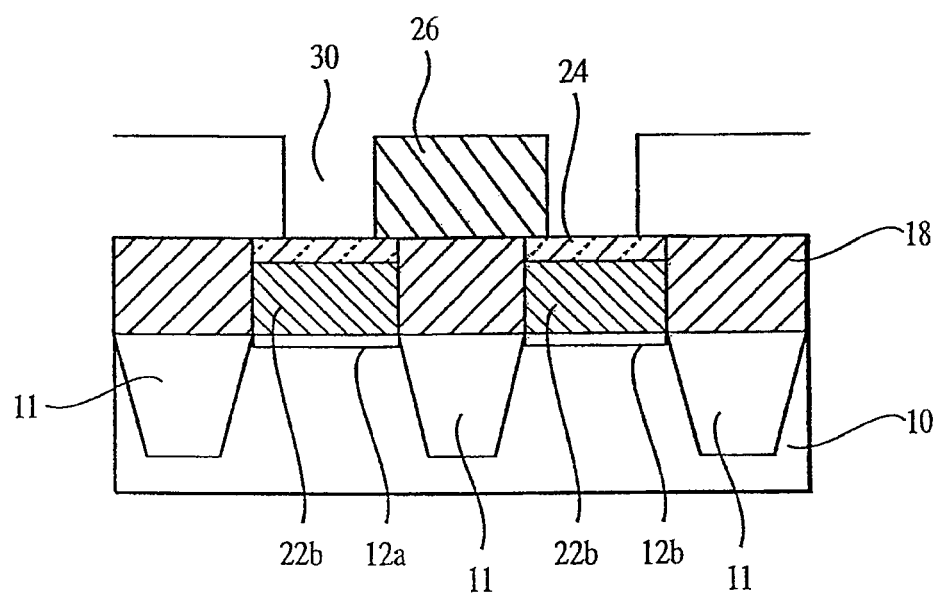

After the forming of the silicide caps 24, bit lines 26 are next formed over selected contact studs 22a and associated silicide cap 24 structures. The bit lines 26 are formed by depositing a conductive layer over the silicide caps 24 and the insulating dielectric layer 18, by any standard method known in the art such as PVD or CVD deposition, and then etching the conductive layer to form bit lines 26. As shown in FIG. 5, the bit lines 26 are not straight. FIGS. 5 and 6 show the bit lines 26, which are delineated from the deposited conductive layer and etched by standard techniques in the art, for example by masking the bit line 26 using any standard photolithography and dry-etching process (FIG. 6 shows a cross-section of FIG. 5 though line VI). As a result, bit lines 26 are formed over some of the contact studs 22a and the associated silicide caps 24 and partially overlying other contact studs 22b and associated silicide caps 24. When the bit lines 26 are formed by etching, the contact studs 22b intended to be contacts for the lower capacitor electrodes are re-exposed.

Figure 7:
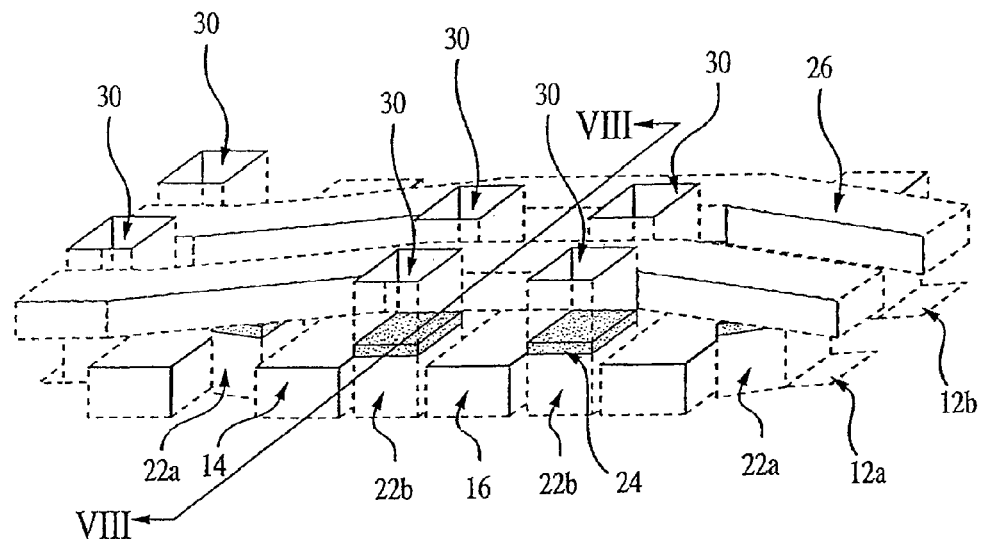
FIG. 7 and FIG. 8 show the structure depicted in FIG. 5 and FIG. 6 at a subsequent stage of processing wherein an insulating layer has been deposited over the bit line and a capacitor hole has been formed.
Figure 8:
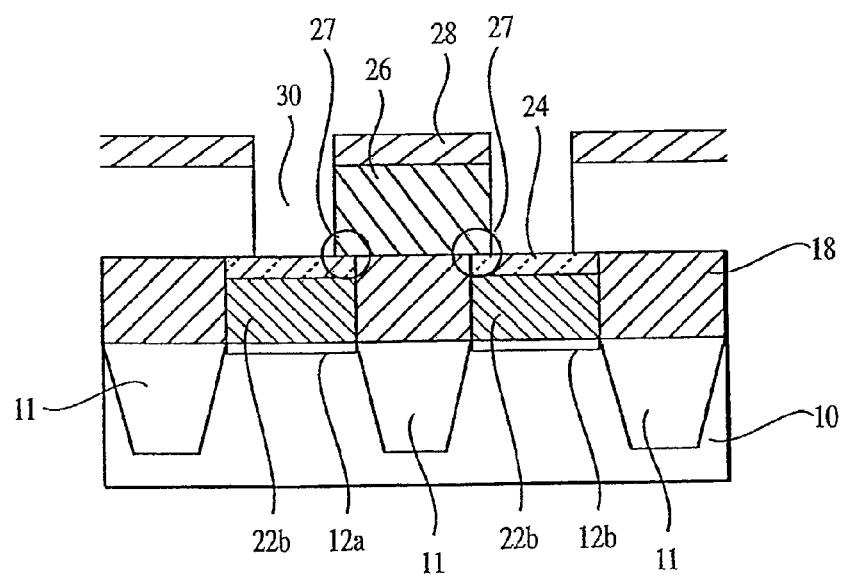

After the formation of the bit lines 26, an interlayer dielectric layer 28 is deposited over and around the bit lines 26. There is no specific preferred material for this interlayer dielectric other than those known in the art which can withstand the selective silicide etch used in subsequent processing steps (such as silicon nitride or BPSG, etc.). This interlayer dielectric layer 28 is then patterned with photoresist and etched by ion plasma dry etching, as shown in FIGS. 7 and 8 (FIG. 8 shows a cross-section of FIG. 7 through line VIII), to form contact-holes 30 to the silicide caps 24 over the contact studs 22b. These contact studs 22b are those not positioned directly beneath the now formed bit lines 26, but may be in partial contact with the bit lines 26, as shown by area 27 in FIG. 8.

Contact studs 22b, shown in FIG. 8, may be in partial contact 27 with the overlying bit lines 26 due to possible overlap of the bit lines 26 with the silicide caps 24 on contact studs 22b caused during the bit line deposition and delineation (see FIGS. 5 and 6) 22, resulting from the close proximity of these electrical features.

Figure 9:
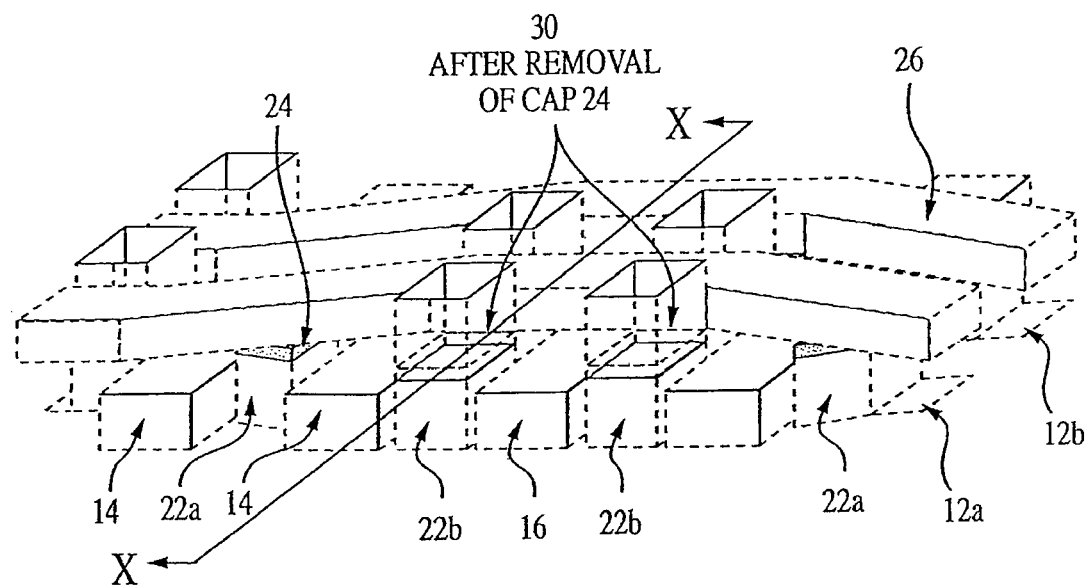
FIG. 9 and FIG. 10 show the structure depicted in FIG. 7 and FIG. 8 at a subsequent stage of processing wherein caps have been selectively removed from atop the contact studs.
Figure 10:
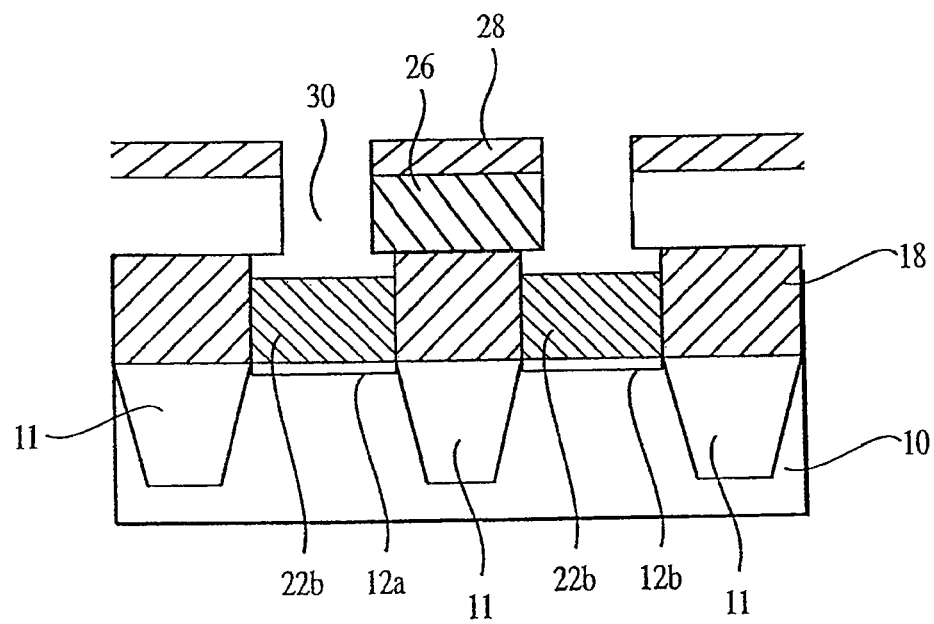

This direct electrical connection 27 is next removed as explained in connection with FIGS. 9 and 10 (FIG. 10 shows a cross-section of FIG. 9 through line X). The exposed silicide caps 24 over contact studs 22b are selectively etched with a negligible effect upon the surrounding structures. This selective etch is accomplished by choosing an etch that can etch the silicide away without significantly affecting the a bit line 26. For instance, if the bit line is formed of tungsten and the silicide is $TiSi_2$, a dilute HF acid solution can remove the silicide without affecting the tungsten bit line. A wet etch, and potentially even an isotropic dry etch, may be used to remove the silicide caps 24 from the contact studs 22b, portions of which may be below the bit lines 26, as shown in FIG. 10.

Figure 11:
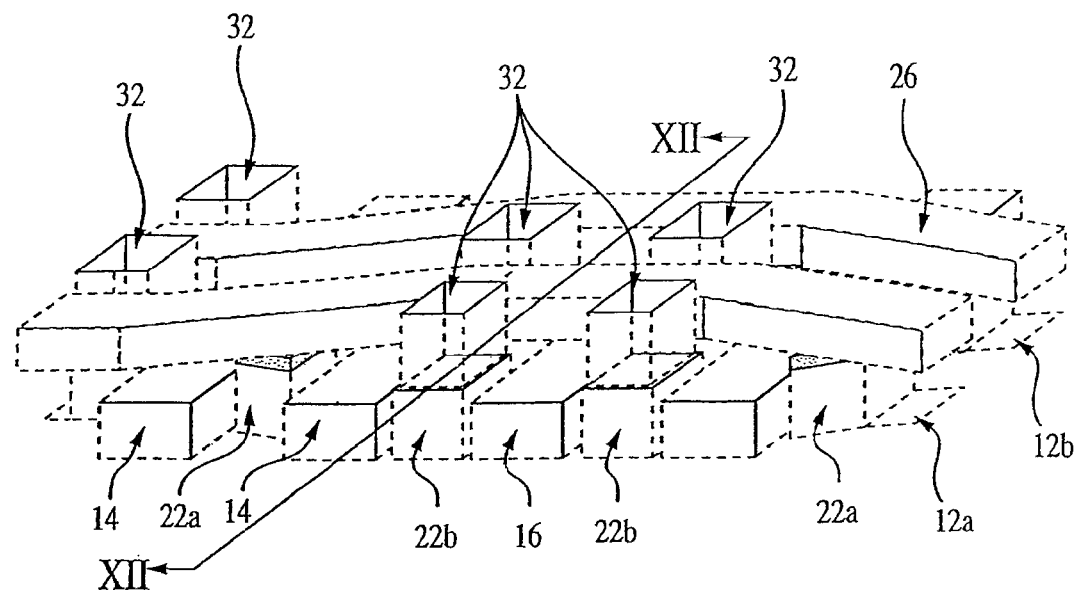
FIG. 11 and FIG. 12 show the structure depicted in FIG. 9 and FIG. 10 at a subsequent stage of processing wherein a thin dielectric layer has been formed over a bit line, a bit line insulating layer, and inside a contact-hole.
Figure 12:
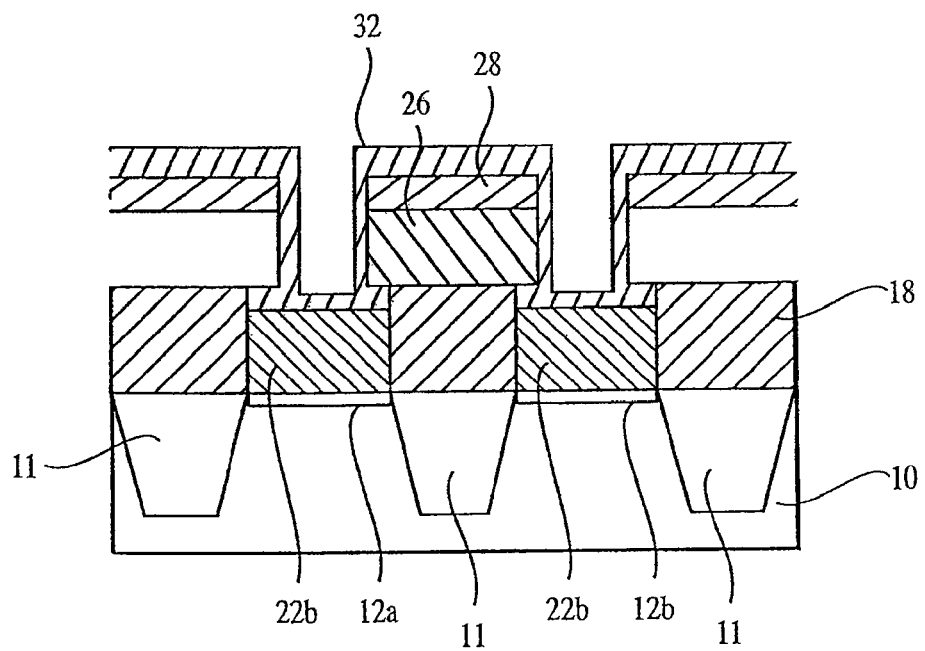

Now that any direct electrical connection between the bit line 26 and the underlying contact stud 22b has been removed, these two electrical features must be further insulated to ensure against undesired potential shorting between them. As shown in FIGS. 11 and 12 (FIG. 12 shows a cross-section of FIG. 11 through line XII), a thin dielectric layer 32 (such as $SiO_2$ or $Si_3N_4$) is deposited over the interlayer dielectric layer 28 and within the contact-holes 30. This thin dielectric layer 32 is deposited using a highly-conformal technique such as CVD to ensure adherence to the interior sides of the contact-holes 30. A preferred material for the thin dielectric layer 32 is silicon nitride.

Figure 13:
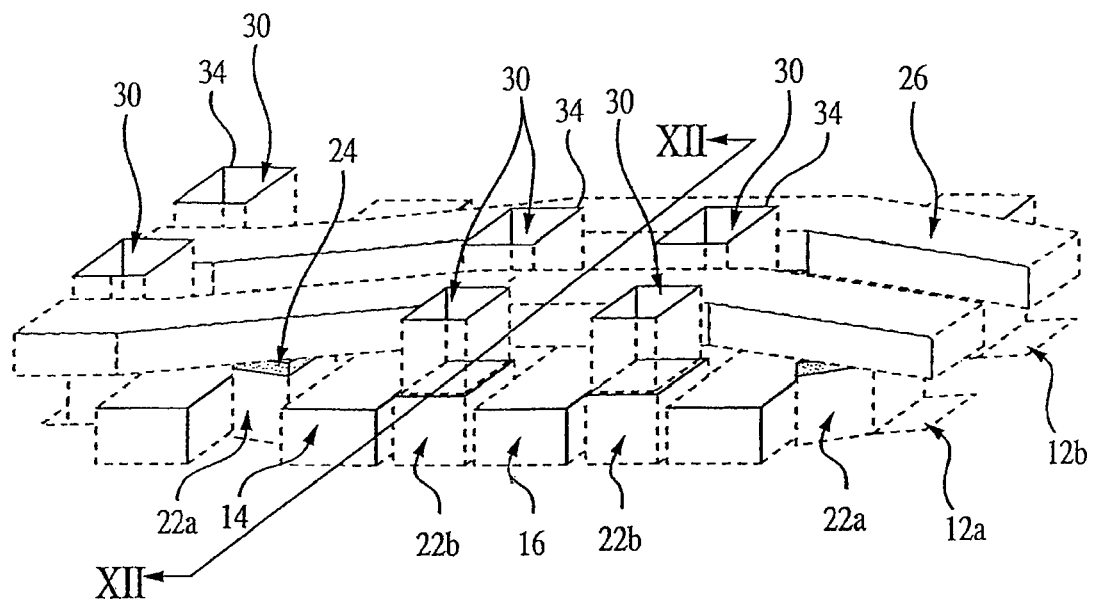
FIG. 13 and FIG. 14 show the structure depicted in FIG. 11 and FIG. 12 at a subsequent stage of processing wherein a capacitor hole has been re-etched leaving an insulating sidewall on the inside of the contact-hole.
Figure 14:
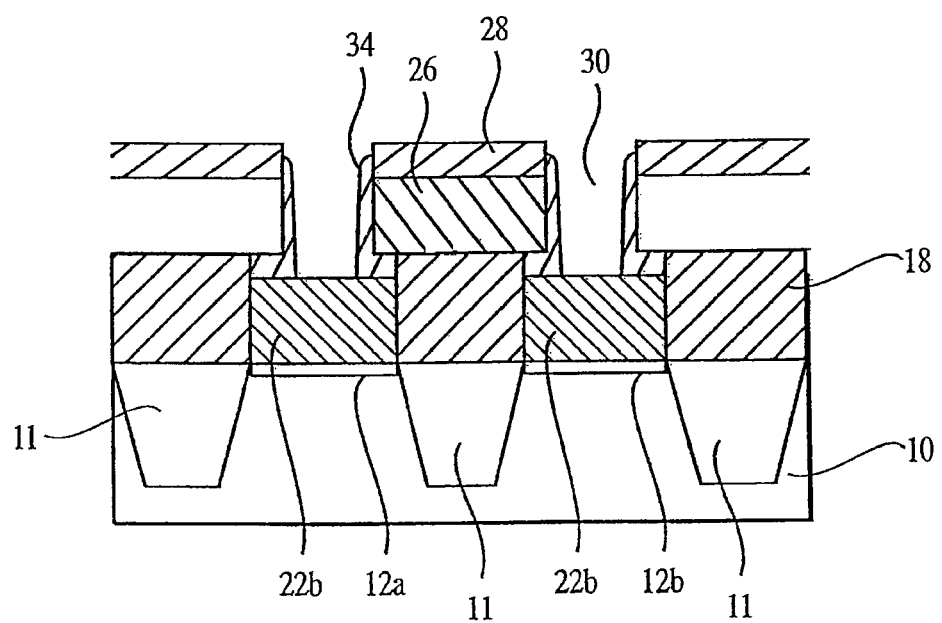

As shown by FIGS. 13 and 14 (FIG. 14 shows a cross-section of FIG. 13 through line XIV), the thin dielectric layer 32 is next etched to re-expose the contact stud 22b and leave an insulating sidewall 34 inside the contact-hole 30, thereby preventing unintended electrical connection and shorting between the bit line 26 and the contact stud 22b, or with a conductive plug 36, which will be deposited in the hole 30. The thin dielectric layer 32 may be etched by any satisfactory method known in the art.

Figure 15:
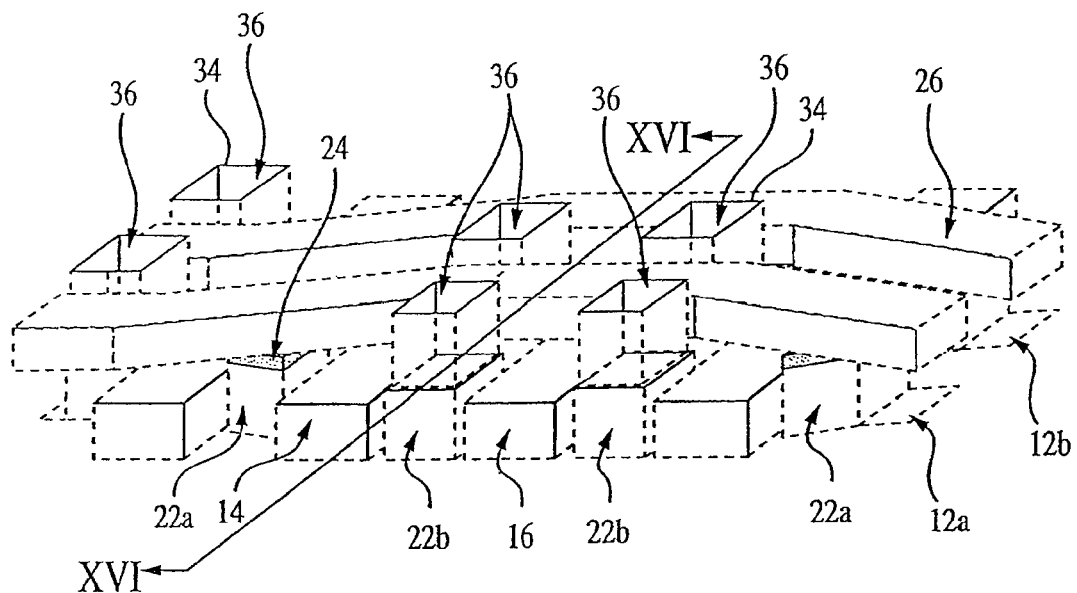
FIG. 15 and FIG. 16 show the structure depicted in FIG. 13 and FIG. 14 at a subsequent stage of processing wherein a conductive plug has been formed inside the contact-hole.
Figure 16:
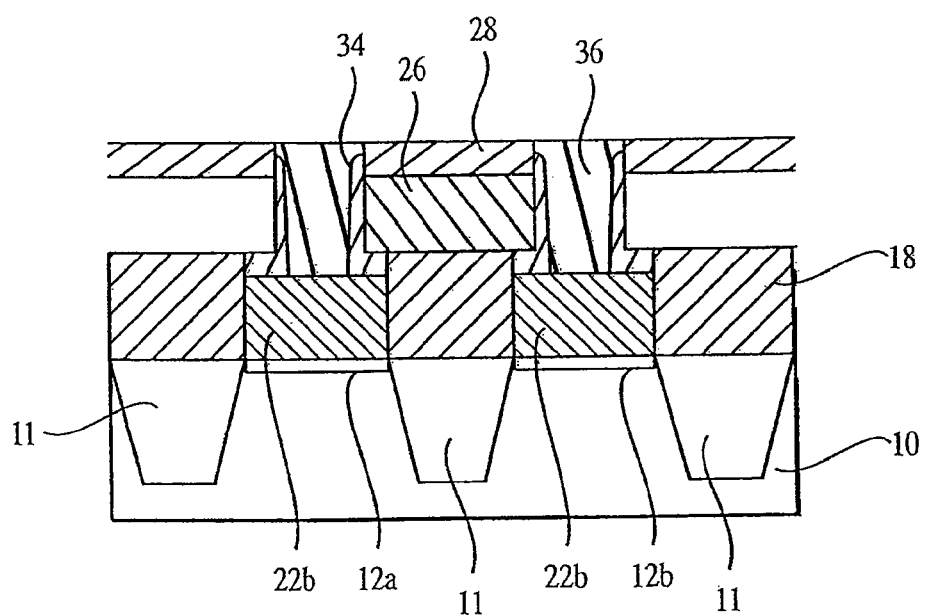

The contact-hole 30 is next filled with a conductive material, such as doped polysilicon or metal, depending upon the physical characteristics of the future overlying capacitor (material, type, structure, etc.) to form a conductive plug 36 as shown in FIGS. 15 and 16 (FIG. 16 shows a cross-section of FIG. 15 through line XVI). If the overlying capacitor is to be polysilicon based (that is, having a polysilicon bottom electrode) then for ease in manufacture the capacitor conductive plug 36 should also be polysilicon. However, if the overlying capacitor is to be metal-based (a bottom electrode consisting of a metal such as W, TiN, Pt, Ru, Al, etc.) then the capacitor conductive plug 36 should also be a metal.

After the formation of the conductive plug 36, standard processing as known in the art may be used to complete the memory device, including conventional capacitor formation and cell metallization to form a completed memory cell.

In another embodiment, the invention may also be used if a silicide cap is not provided over the contact studs 22a, 22b. In such a configuration, the interconnect lines 26 are connected directly to selected contact studs 22a and other non-selected contact studs 22b are isolated from the interconnect lines by the selective removal of an upper-portion of the non-selected contact studs 22b, as opposed to the selective removal of the silicide caps 24 described above. The removed upper-portion of the contact studs should generally conform in thickness to the similarly removed silicide caps 24 described above with respect to FIG. 8 of the first embodiment. After removal of the upper-portion of the non-selected contact studs 22b, the structure shown in FIG. 10 is attained and the subsequent processing described and illustrated with respect to FIGS. 11 to 16 is carried out.

Figure 17:
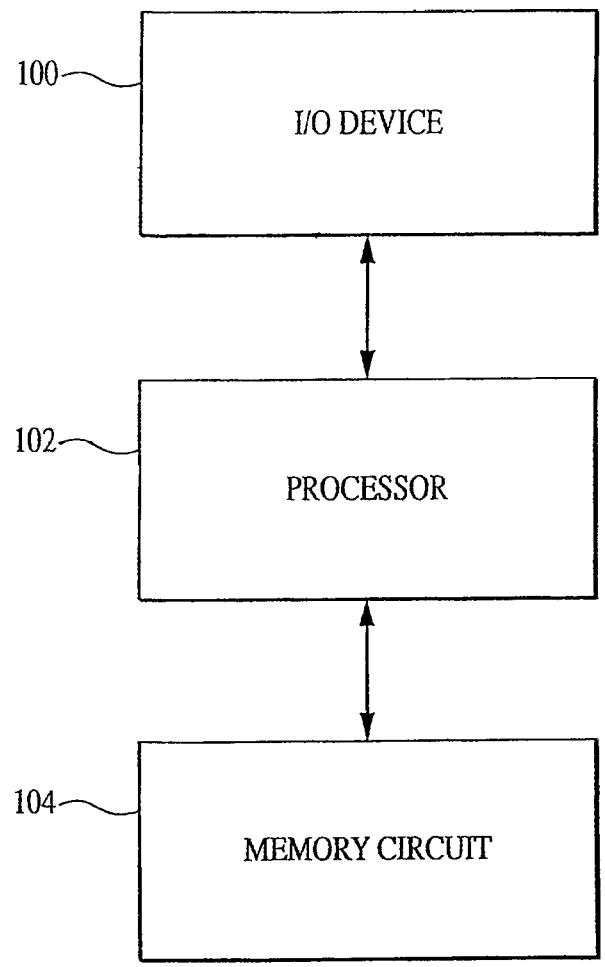
FIG. 17 depicts a processor-based system including a semiconductor device formed in accordance with the present invention.

FIG. 17 illustrates a processor-based system (e.g., a computer system), with which a memory having memory cells constructed as described above may be used. The processor-based system comprises a central processing unit (CPU) 102, a memory circuit 104, and an input/output device (I/O) 100. The memory circuit 104 contains a DRAM memory circuit including semiconductor devices constructed in accordance with the present invention. Also, the CPU 102 may itself be an integrated processor which utilizes semiconductor devices constructed in accordance with the present invention, and both the CPU 102 and the memory circuit 104 may be integrated on a single chip.

Although the (COB) DRAM structure used in both the example of the existing related art and in the invention described has a particular layout and is of $6F^2$ design, this does not preclude application of this invention to any other COB DRAM design, nor to any other particular semiconductor device, so long as it is necessary to electrically connect an interconnect line to one particular underlying contact stud while electrically isolating it from another closely positioned or partially underlying contact stud. For other devices, this invention could be applied wherever an interconnect line needs to be connected to one contact while remaining isolated from an adjacent contact, especially when the tight spacing between the contacts will not allow sufficient room for routing of the line away from the contact to remain isolated.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

What is claimed as new and desired to be protected by Letters Patent of the United States is:

1. A processor-based system, comprising:
   a processor; and
   a memory device connected to said processor, said memory device comprising:
   a first conductive stud and a second conductive stud;
   a bit line over and in electrical contact with said first conductive stud, wherein said bit line also overlies a portion of said second conductive stud without making electrical contact to the second conductive stud; and
   an insulating sidewall formed along a side of said bit line and having a portion extending laterally beneath said bit line, where said bit line overlies a portion of said second conductive stud, the portion of the insulating sidewall separating said bit line from said second conductive stud.

2. The processor-based system of claim 1, wherein said sidewall is formed within a contact opening and extends around said contact opening to said second conductive stud and said contact opening extends through a dielectric layer which is over and around said bit line.

3. The processor-based system of claim 2, wherein said contact opening is filled with a conductive plug.

4. The processor-based system of claim 1, wherein said first and second conductive studs are connected to respective source and drain regions of a transistor.

5. A method of forming a memory cell, comprising:
forming a first conductive stud and a second conductive stud on respective active areas of a semiconductor substrate;
forming a bit line over and in electrical contact with said first conductive stud such that said bit line overlies a portion of said second conductive stud without making electrical contact to the second conductive stud; and
forming an insulating sidewall along a side of said bit line and having a portion extending laterally beneath said bit line, where said bit line overlies a portion of said second conductive stud, the portion of the insulating sidewall separating said bit line from said second conductive stud.

6. The method of claim 5, further including forming a first silicide cap on top of said first contact stud.

7. The method of claim 6, further including forming a second silicide cap on top of said second contact stud.

8. The method of claim 5, wherein said first and second conductive plugs are formed of selectively deposited epitaxial silicon.

9. The method of claim 5, further including forming said insulating sidewall within a contact opening to extend around said contact opening to said second conductive stud.

10. The method of claim 9, further including forming said contact opening to extend through a dielectric layer that surrounds said bit line.

11. The method of claim 9, further including filling said contact opening with a conductive plug.

12. The method of claim 5, further including connecting said first and second conductive studs to respective source and drain regions of a transistor.

* * * * *